United States Patent [19]

Anami

[11] Patent Number: 5,193,074
[45] Date of Patent: Mar. 9, 1993

[54] SEMICONDUCTOR MEMORY DEVICE HAVING HIERARCHICAL ROW SELECTING LINES

[75] Inventor: Kenji Anami, Hyogo, Japan

[73] Assignee: Mitsubishi Denki Kabushiki Kaisha, Tokyo, Japan

[21] Appl. No.: 646,910

[22] Filed: Jan. 28, 1991

[30] Foreign Application Priority Data

Feb. 9, 1990 [JP] Japan .................................. 2-30837

[51] Int. Cl.⁵ .............................................. G11C 8/02
[52] U.S. Cl. ........................... 365/230.03; 365/230.06
[58] Field of Search ..................... 365/230.03, 230.06

[56] References Cited

U.S. PATENT DOCUMENTS

| | | | |
|---|---|---|---|
| 4,542,486 | 9/1985 | Anami et al. | 365/230 |
| 4,554,646 | 11/1985 | Yoshimoto et al. | 365/189 |
| 4,796,234 | 1/1989 | Itoh et al. | 365/230.03 X |
| 4,855,957 | 8/1989 | Nogami | 365/230.03 |
| 4,908,798 | 3/1990 | Urai | 365/230.03 |
| 5,033,024 | 7/1991 | O'Connell et al. | 365/230.03 X |
| 5,034,928 | 7/1991 | Isobe | 365/230.03 |
| 5,083,294 | 1/1992 | Okajima | 365/230.03 X |

FOREIGN PATENT DOCUMENTS

58-211393 8/1983 Japan .

OTHER PUBLICATIONS

IEEE Publication "A 25ns Full-CMOS 1Mb SRAM", by List et al., International Solid-State Circuits Conference, 1988.
IEEE Publication "A 14ns 1Mb CMOS SRAM with Variable Cit-Organization", by Wada et al., International Solid-State Circuits Conference, 1988.
IEEE Publication "A 15ns 1Mb CMOS SRAM", by Sasaki et al., International Solid-State Circuits Conference, 1988.

Primary Examiner—Eugene R. LaRoche
Assistant Examiner—Do Hyun Yoo
Attorney, Agent, or Firm—Lowe, Price, LeBlanc & Becker

[57] ABSTRACT

A memory cell array of this semiconductor memory device includes a plurality of memory cells each having one transistor and one capacitor and is divided into a plurality of large memory cell groups, and each of the large memory cell groups is further divided into a plurality of small memory cell groups. A plurality of main row-selecting lines, a plurality of sub row-selecting lines and a plurality of word lines are provided in the memory cell array, each of the large memory cell groups and each of the small memory cell groups, respectively. Main global decoders select one of the main row-selecting lines in response to an internal address signal. Sub global decoders select a sub row-selecting line associated with the selected main row-selecting line in the large memory cell group selected by a large memory cell group selecting signal. Local decoders select a word line associated with the selected sub row-selecting line in the small memory cell group selected by a small memory cell group selecting signal.

40 Claims, 15 Drawing Sheets

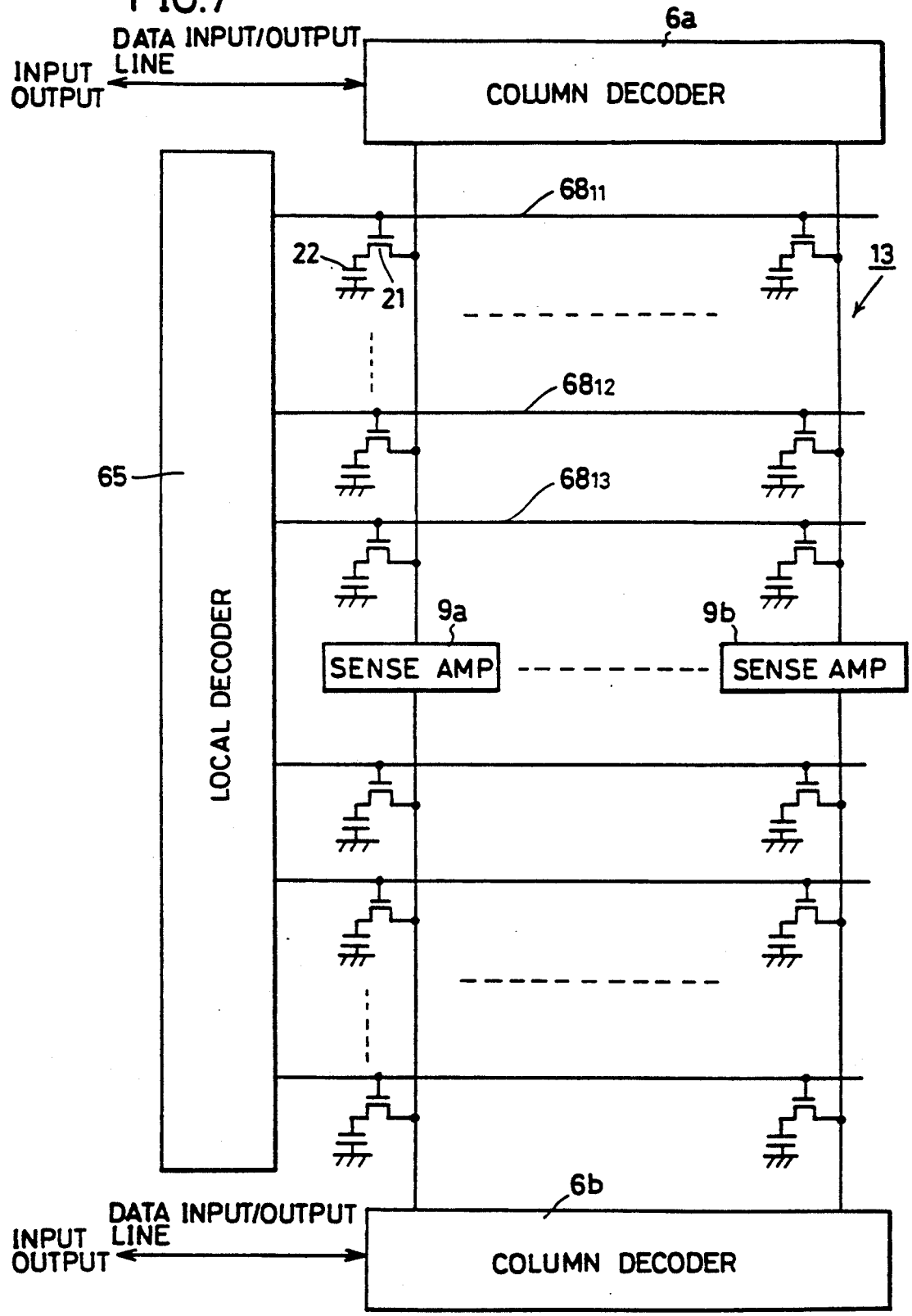

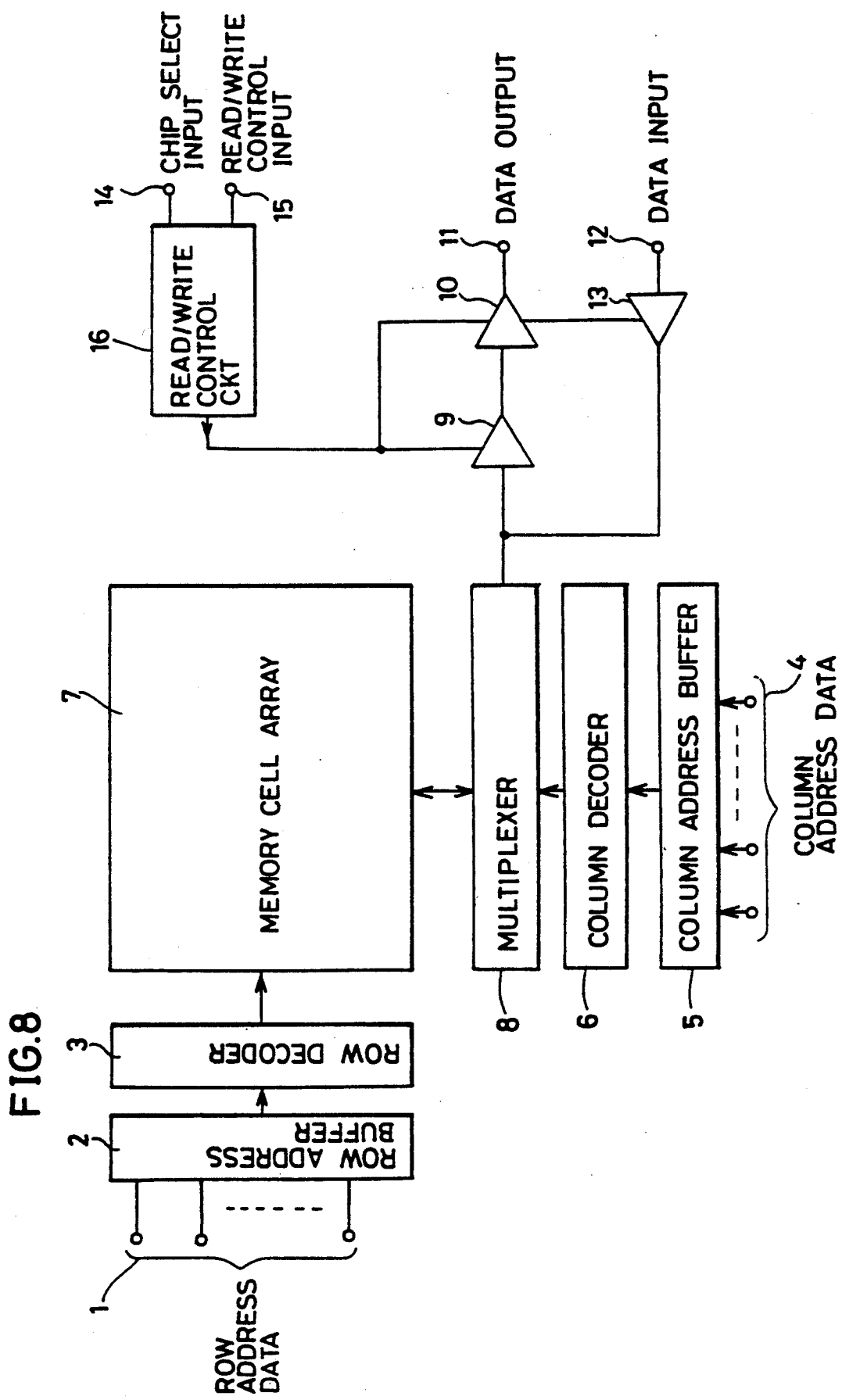

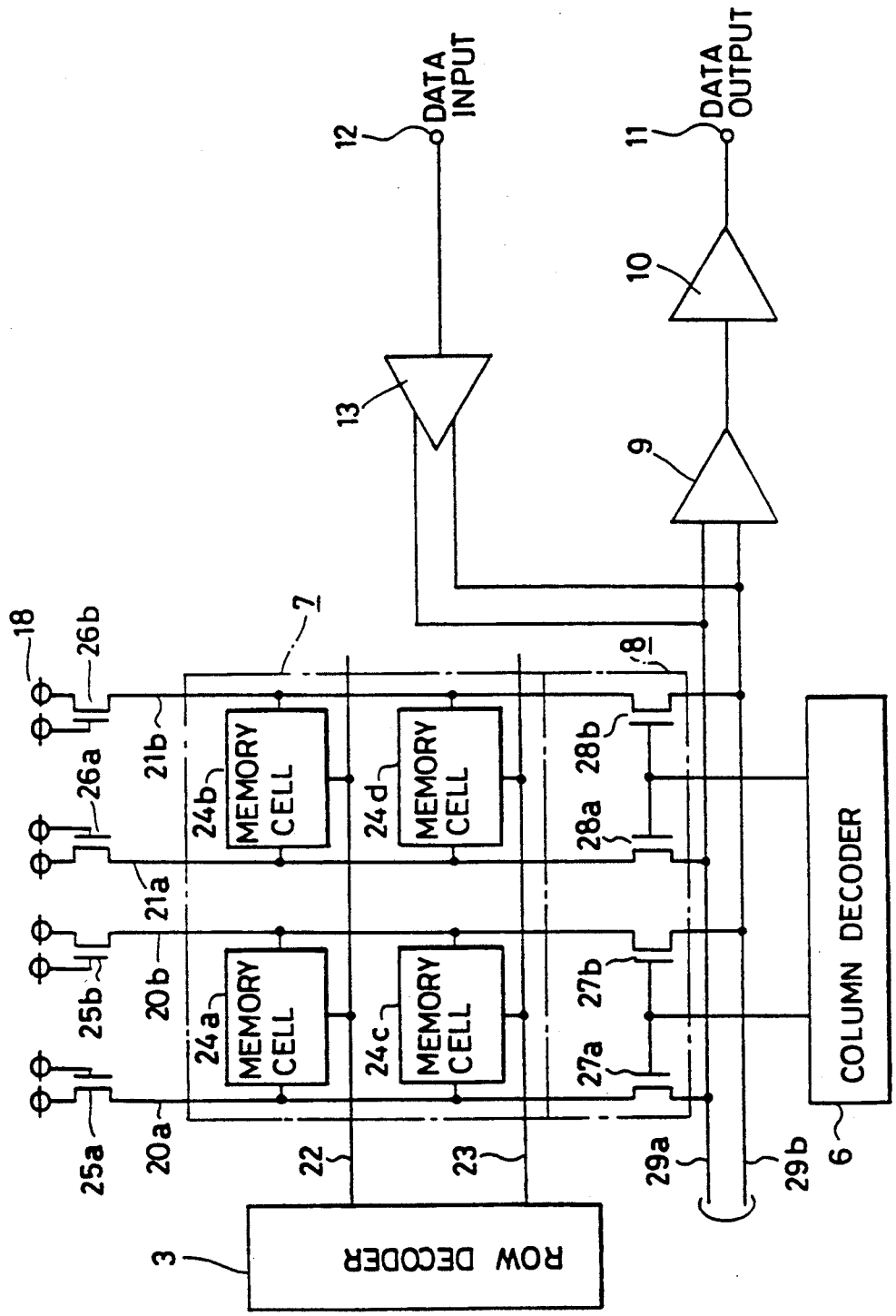

SEMICONDUCTOR MEMORY DEVICE HAVING HIERARCHICAL ROW SELECTING LINES

BACKGROUND OF THE INVENTION

1. Field of the Invention

The present invention relates generally to semiconductor memory devices having hierarchical row selecting lines and, more particularly, to a semiconductor memory device operative with an improved access time, decreased power consumption and enhanced reliability by providing hierarchical row selecting lines and word lines therein.

2. Description of the Background Art

FIG. 8 is a block diagram showing a first example of a conventional semiconductor memory device. Referring to the figure, row address data is externally applied to a row address input terminal group 1 to be amplified or inverted by a row address buffer 2, and then applied to a row address decoder 3. The row address decoder 3 decodes the row address data applied via input terminal group 1.

Column address data is externally applied to a column address input terminal group 4 to be amplified or inverted by a column address buffer 5, and then applied to a column address decoder 6. The column decoder 6 decodes the column address data applied via input terminal group 4. A memory cell array 7 is formed of a plurality of memory cells arranged in matrix for storing information. A read voltage having a small amplitude read from memory cell array 7 is supplied via a multiplexer 8 to a sense amplifier 9 to be amplified. An output of sense amplifier 9 is further amplified by an output data buffer 10 to a required level that the output is extracted to the outside of the semiconductor memory device, and is then externally outputted via a read data output terminal 11.

Write data is applied to a write data input terminal 12 to be amplified by an input data buffer 13. Further, a terminal 14 is supplied with a chip select input signal, while a terminal 15 is supplied with a read/write control signal. A read/write control circuit 16 controls sense amplifier 9, output data buffer 10 and input data buffer 13 in accordance with chip selection/non-selection and data read/write mode which are determined by those signals.

FIG. 9 is a diagram showing the configuration of peripheries of memory cell array 7 in the semiconductor memory device shown in FIG. 8. FIG. 9 shows, for simplification, a double-row double-column configuration of memory cell array 7. Referring to FIG. 9, memory cells 24a-24d are provided at respective intersections of bit line pairs 20a, 20b and 21a, 21b and word lines 22 and 23 connected to an output end of row decoder 3. In addition, a plurality of bit line loads 25a, 25b, 26a and 26b are provided having their respective one ends connected to a power source 18 and the other ends connected to their corresponding bit lines.

Further, transfer gates 27a, 27b, 28a and 28b constituting multiplexer 8 shown in FIG. 8 are provided each having its gate supplied with an output signal of column decoder 6 shown in FIG. 8, its drain or source connected to its corresponding bit line and its source or drain connected to a corresponding one of input/output lines (hereinafter referred to as I/O lines) 29a and 29b in a pair. A potential difference between I/O lines 29a and 29b is detected by sense amplifier 9, and an output thereof is amplified by output buffer 10.

For each memory cell 24 in FIG. 9, for example, a high resistance load-type MOS memory cell shown in FIG. 10A or a CMOS-type memory cell shown in FIG. 10B is employed.

The memory cell shown in FIG. 10A comprises driver transistors 41a and 41b. The transistor 41a has its drain connected to a storage node 45a, its gate connected to a storage node 45b and its source grounded. The transistor 41b has its drain connected to storage node 45b, its gate connected to storage node 45a and its source grounded. The memory cell 24 further comprises access transistors 42a and 42b. The transistor 42a has its drain or source connected to storage node 45a, its gate connected to word line 22 or 23 and its source or drain connected to bit line 20a or 21a. The transistor 42b has its drain or source connected to storage node 45b, its gate connected to word line 22 or 23 and its source or drain connected to bit line 20b or 21b. The memory cell 24 further comprises load resistors 43a and 43b having their respective one ends connected to power source 18 and the other ends connected to respective storage nodes 45a and 45b.

The memory cell 24 shown in FIG. 10B comprises p channel transistors 44a and 44b in place of load resistors 43a and 43b of memory cell 24 shown in FIG. 10A. The transistor 44a has its drain connected to storage node 45a, its gate connected to storage node 45b and its source connected to power source 18. The transistor 44b has its drain connected to storage node 45b, its gate connected to storage node 45a and its source connected to power source 18.

An operation of the conventional semiconductor memory device shown in FIGS. 8 to 10B will now be described. Such case is considered that memory cell 24a in memory cell array 7 is selected. In this case, a row address signal corresponding to a row, to which memory cell 24a to be selected is coupled, is inputted from row address input terminal group 1, so that word line 22 to which memory cell 24a is connected attains a selection level (e.g., logical high or the H level) and the other word line 23 attains a non-selection level (e.g., logical low or the L level).

Meanwhile, a column address signal for selecting a column corresponding to bit line pair 20a, 20b, to which memory cell 24a to be selected is connected, is inputted from column address input terminal group 4, so that only transfer gates 27a and 27b connected to that bit line pair 20a, 20b are rendered conductive. Consequently, only the selected bit lines 20a and 20b are connected to a pair of I/O lines 29a and 29b, respectively. The other bit lines 21a and 21b become a non-selection state and then separated from I/O line pair 29a, 29b.

A read operation of selected memory cell 24a will now be described with reference to a timing chart of FIG. 15. It is now assumed that storage node 45a of memory cell 24a is at the H level and storage node 45b is at the L level. At this time, one driver transistor 41a in the memory cell is nonconductive, while the other driver transistor 41b is conductive. Access transistors 42a and 42b of memory cell 24a are both conductive since word line 22 is in the selection state at the H level. Accordingly, a direct current flows through such a path as power source 18→bit line load 25b→bit line 20b→access transistor 42b→driver transistor 41b→ground.

However, a direct current does not flow through the other path, power source 18→bit line load 25a→bit line $20a \to$ access transistor $42a \to$ driver transistor $41a \to$ ground because driver transistor $41a$ is non-conductive. At this time, a potential on bit line $20a$, through which the direct current does not flow, attains a value obtained by (supply potential $-$Vth) where a threshold voltage of bit line load transistors $25a$, $25b$, $26a$ and $26b$ is Vth.

Meanwhile, a potential on bit line $20b$, through which the direct current flows, becomes a value obtained by (power supply potential $-$Vth $-\Delta$V) since the potential is divided by conductive resistances of driver transistor $41b$, access transistor $42b$ and bit line load $25b$ and consequently decrease by $\Delta$V from (power supply potential $-$Vth). Here, $\Delta$V is called a bit line amplitude, which is normally about 50–500 mV and is controlled depending on the magnitude of the bit line load.

This bit line amplitude appears on I/O lines $29a$ and $29b$ via conductive transfer gates $27a$ and $27b$ to be amplified by sense amplifier 9. After further amplified in output buffer 10, the output of sense amplifier 9 is read out of output terminal 11 as a data output. In reading, input data buffer 13 is controlled by read/write control circuit 16 so as not to drive I/O line pairs $29a$, $29b$.

In writing, data is written in the memory cell by forcedly lowering the potential on the bit line, in which data of the L level is to be written, down to a lower potential and raising the potential on the other bit line up to a higher potential. For writing inverted data in memory cell $24a$, for example, data input buffer 13 causes I/O line $29a$ to attain the L level and the other I/O line $29b$ to attain the H level. Accordingly, bit line $20a$ attains the L level and the other bit line $20b$ attains the H level, so that the data is written in memory cell $24a$.

FIG. 11 is an electrical circuit diagram showing a sense amplifier and I/O line driving circuit. Referring to the figure, NchMOSFETs 59 and 60 constitute a differential input circuit, having their gates supplied with differential input signals Vin and $\overline{\text{Vin}}$, respectively. The respective sources of NchMOSFETs 59 and 60 are connected in common to a power-down NchMOSFET 61. The NchMOSFET 61 is rendered conductive in response to a chip enable signal (CE) inputted to an input terminal 62. The NchMOSFETs 59 and 60 have their respective drains connected to respective drains of PchMOSFETs 57 and 58 constituting a current mirror circuit, their respective sources connected to a power source Vcc and their respective gates connected in common. An amplification output is obtained from a connection point between NchMOSFET 60 and PchMSOFET 58.

An I/O line load circuit 50 comprises NchMOSFETs 55 and 56 having their respective sources connected to a pair of I/O line $29a$ and $\overline{\text{I/O}}$ line $29b$ to be active loads. The I/O line $29a$ and $\overline{\text{I/O}}$ $29b$ are connected via respective terminals 51 and 52 to the respective sources of selecting MOSFETs 27 and 28 and to memory cell 24 shown in FIG. 9. The respective gates and drains of MOSFETs 55 and 56 are connected in common to a power supply Vcc.

FIG. 12 is a diagram showing one example of the layout of the memory cell shown in FIG. 10A. Referring to FIG. 12, an active region 82 is surrounded by an isolation region 81. A first polysilicon 81 formed of polysilicon or silicide is connected to active region 82 by a shared contact 84. A second polysilicon 85 formed of polysilicon or silicide connects, through shared contact 84, active region 82 and another active region 82 or first polysilicon 83 and another first polysilicon 83.

A second polysilicon contact 86 is provided on second polysilicon 85. There further formed a third polysilicon 87 employed as a high resistance load, a contact 88 and an aluminum interconnection 89.

In the figure, the denotation $85a$ represents a memory cell power source line, and $89a$, $82a$ and $82b$ represent portions to be ground of the memory cell. A transistor $41a$ has a drain $82c$, a gate $83a$ and a source $82a$. A transistor $41b$ has a drain $82d$, a gate $83b$ and a source $82b$. A transistor $42a$ has a drain $82g$, a gate $83c$ and a source $82c$. A transistor $42b$ has a drain $82f$, a gate $83c$ and a source $82e$. Resistors $43a$ and $43b$ shown in FIG. 10A comprise third polysilicon $87a$ and $87b$, respectively. The gate $83c$ constitutes a word line, and portions $89b$ and $89c$ constitute bit lines. As apparently seen from FIG. 12, the width of first polysilicon 83 is a gate length L, and the area of first polysilicon 83 occupies a large portion of a cell area.

FIG. 13 is a cross-sectional view of the memory cell shown in FIG. 12 taken along the lines I—I'. Referring to FIG. 13, an active region 82 is surrounded by an isolation region 81. The reference numeral 83 denotes a first polysilicon formed of polysilicon or silicide; 84 denotes a shared contact for coming in contact with active region 82 or first polysilicon 83 in common; 85 denotes a second polysilicon formed of polysilicon or silicide for connecting active region 82 and another active region 82 or first polysilicon and another first polysilicon through shared contact 84; 86 denotes a second polysilicon contact provided on the second polysilicon; 87 denotes a third polysilicon employed as a high resistance load; 88 denotes a contact; 89 denotes a first layer of aluminum; 99 denotes a second layer of aluminum not shown in FIG. 12; and 92–98 denote insulating films.

FIG. 14 shows a double-row eight-column structure out of the memory cell array shown in FIG. 12. This figure shows, for simplification, only isolation region 81, first polysilicon 83, contact 88 and aluminum 89. The denotation $89a$ represents aluminum of ground line provided for every four columns, and $89b$ and $89c$ represent aluminum of bit lines. In this example, a ground potential of the memory cell is provided through the aluminum provided every four columns and through a band-like diffusion region extending perpendicularly to the aluminum in order to reduce the area of layout.

Since the conventional semiconductor memory device is configured as described above, all the memory cells on the same substrate are activated to let a current flow therein from the power source. Therefore, there has been such a disadvantage especially in the configuration of a large capacity semiconductor memory device that a total power consumption becomes increased.

Furthermore, in the large capacity semiconductor memory device, an increase in length of word lines increases the entire resistance of the word lines formed of polysilicon, molybdenum silicide, tungsten silicide or the like having higher resistance than metal. In addition, an increased number of memory cells connected to the same word line causes an increased capacitive load. Consequently, delay time on the word lines is increased, resulting in another disadvantage that a high speed access cannot be performed.

In order to eliminate these disadvantages, a second conventional example of the semiconductor memory device is proposed as shown in FIG. 16, which is, for example, disclosed in Japanese Patent Laying-Open No. 58-211393 and U.S. Pat. No. 4,542,486. This semiconductor memory device comprises N memory cell groups formed by dividing in a column direction a memory cell array formed of memory cells arranged in matrix, memory cell group selecting lines for each selecting a corresponding one of the N memory cell groups, row decoders for each decoding a row address signal of the memory cell group to be accessed, preceding word lines each connected to an output terminal of the corresponding one of the row decoders, AND function gates for each taking a logical product of a selecting signal on the memory cell group selecting line and an output signal on the preceding word line, and word lines connected to output terminals thereof. The preceding word lines and the latter word lines are arranged in parallel in a row direction. FIG. 16 shows one example of such a semiconductor memory device where the memory cell array is divided into N (3) blocks in the column direction to form N (3) memory cell groups 51a–51c.

Referring to FIG. 16, memory cell group selecting lines 52a–52c select their corresponding memory cell groups 51a–51c. A plurality of preceding word lines 55 are connected to outputs of row decoders 54 and are arranged in parallel in one direction. Furthermore, a plurality of AND function gates 56a–56c are provided having their inputs connected to the preceding word lines 55 and the corresponding memory cell group selecting lines. Word lines 53a–53c are connected to the respective outputs of these gates.

Operation of the second conventional example of this semiconductor memory device will now be described. Referring to FIG. 16, word line 53a in memory cell group 51a, for example, is activated by a switching gate 56a receiving as its inputs a signal on preceding word line 55 as a row selecting line and a signal on memory cell group selecting line 52a running vertically to preceding word line 55. In the device of FIG. 16, the time to select a particular row is determined by a delay time on preceding word line 55 and that on word line 53a.

A capacitance of preceding word line 55 does not include a gate capacitance which is the sum of a gate-drain capacitance, gate-source capacitance and gate-substrate capacitance of access transistors 42a and 42b in each memory cell, and hence the capacitance is considerably smaller than the capacitance of a conventional word line including those capacitances. In addition, word line 53a is so short that a CR delay thereon is negligible. Therefore, the employment of the second conventional example makes it possible to substantially reduce the time to select a particular row compared to the conventional.

Moreover, since preceding word line 55 does not constitute a gate electrode, materials of preceding word line as the row selecting line can be selected independently of a work function, and a variety of low resistance materials can be employed.

Since only the memory cells connected to a single word line 53a in the selected memory cell group are accessed in this second conventional example, an ineffective current flowing into the memory cells from the load transistors of the bit lines can be reduced to the amount of 1/(the number of blocks) compared to the conventional, and thus power consumption can also be reduced at the same time.

In the second conventional example of the semiconductor memory device thus structured, however, a memory cell array need be divided into a large number of blocks for achieving lower power consumption. In a larger capacity semiconductor memory device, as the number of AND function gates 56 connected to a single preceding word line 55 becomes increased, the length of the preceding word line 55 itself becomes increased. Accordingly, there was a disadvantage that the capacitance and resistance of the preceding word line 55 both increase, and thus a delay on preceding word line 55 increases.

Moreover, since the large capacity semiconductor memory device requires a large number of divided blocks of the memory cell array for achieving lower power consumption as described above, the capacitance of preceding word line 55 becomes increased, and thus a MOS transistor of row decoder 54 for driving preceding word line 55 operates in a saturation region over a long period of time. This results in such a problem in reliability that due to a so-called hot electron effect in which an intensity of an electric field is increased in a channel region of a miniaturized MOS transistor to allow electrons to flow into a gate oxide film, thereby raising a threshold value of the transistor, a threshold voltage of the MOS transistor fluctuates in time, leading to a shift in access time of the semiconductor memory device. Therefore, due to the disadvantages pointed out in the above, it has been impossible to divide the memory cell array into multi-block in the large capacity semiconductor memory device.

In addition, there has been another problem in reliability of the large capacity semiconductor memory device such that due to the increased capacitance of preceding word line 55 which results in an increase in charge/discharge currents flowing through preceding word line 55, a migration of aluminum occurs thereby causing a disconnection particularly in case where the preceding word line is formed of aluminum metal.

SUMMARY OF THE INVENTION

An object of the present invention is to substantially reduce access time of a large capacity semiconductor memory device.

Another object of the present invention is to reduce power consumption of a large capacity semiconductor memory device.

A further object of the present invention is to enhance reliability of a large capacity semiconductor memory device.

A still further object of the present invention is to reduce delay on a row selecting line by reducing capacitance and resistance of the row selecting line.

A still further object of the present invention is to prevent a fluctuation in access time of a semiconductor memory device due to a hot electron effect by reducing capacitance of the row selecting line.

Still another object of the present invention is to reduce a charge/discharge current flowing through the row selecting line to prevent a disconnection of the row selecting line by reducing capacitance of the row selecting line.

To summarize, a semiconductor memory device according to the present invention includes a memory cell array formed of a plurality of memory cells arranged in matrix each having one transistor and one capacitor, the memory cell array being divided in a column direction into a plurality of large memory cell groups, each of the plurality of large memory cell groups being further divided in the column direction into a plurality of small memory cell groups; a plurality of first row selecting lines provided in the memory cell array; a plurality of second row selecting lines provided in each of the plurality of large memory cell groups; a plurality of word lines connected to the memory cells provided in each of the plurality of small memory cell groups; signal lines for each supplying a first selecting signal for selecting a corresponding one of the plurality of large memory cell groups; signal lines for each supplying a second selecting signal for selecting a corresponding one of the plurality of small memory cell groups; first decoders for selecting a corresponding one of the first row selecting lines and activating the same in response to an internal address signal; a plurality of second decoders provided for each large memory cell group for each selecting a second row selecting line associated with the selected first row selecting line and activating the same in the large memory cell group selected by the first selecting signal; and a plurality of third decoders provided for each small memory cell group for each selecting a word line associated with the selected second row selecting line and activating the same in the small memory cell group selected by the second selecting signal.

It is a principal advantage of the present invention that in a large capacity semiconductor memory device including a plurality of memory cells each having one transistor and one capacitor, capacitance and resistance of each of the row selecting lines can further be reduced by separately providing the row selecting lines and word lines and by dividing each row selecting line into first and second row selecting lines, leading to a higher access speed and enhanced reliability in operation.

It is another advantage of the present invention that the total number of load gates to be driven in one cycle of the operation of the semiconductor memory device can further be reduced, resulting in a further reduction in power consumption.

It is a further advantage of the present invention that materials of and manufacturing processes of the word lines and row selecting lines can be selected in a wider range.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a diagram showing memory cells employed in each embodiment of the present invention;

FIG. 8 is a block diagram showing a first conventional example of a semiconductor device;

FIG. 9 is a diagram showing a peripheral structure of a memory cell array of the semiconductor memory device shown in FIG. 8;

DESCRIPTION OF THE PREFERRED EMBODIMENTS

First of all, the configuration of a semiconductor memory device according to a first embodiment of the present invention will be described with reference to FIGS. 1 and 2.

Figure 1:
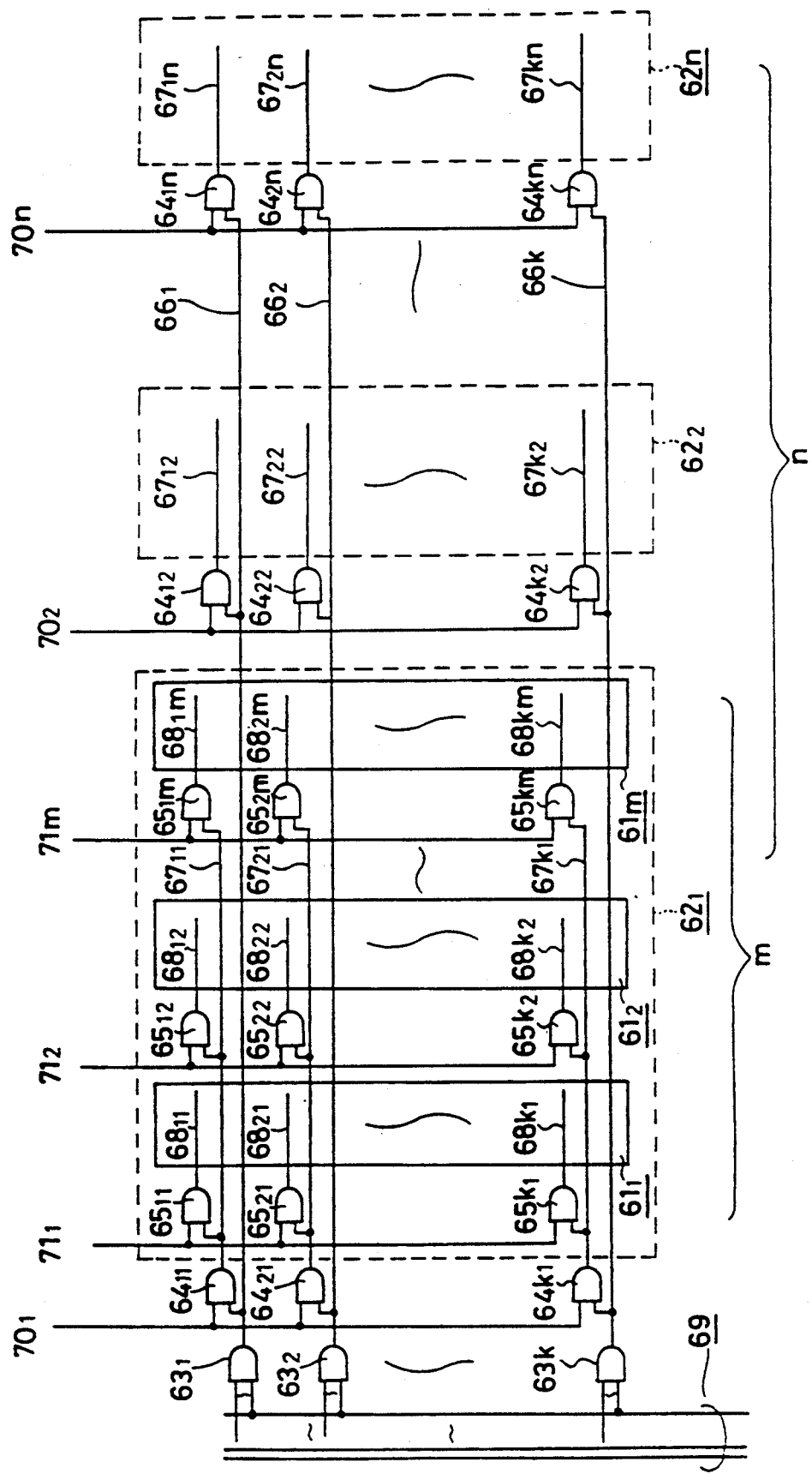
FIG. 1 is a block diagram showing a semiconductor memory device according to a first embodiment of the present invention.
Figure 2:
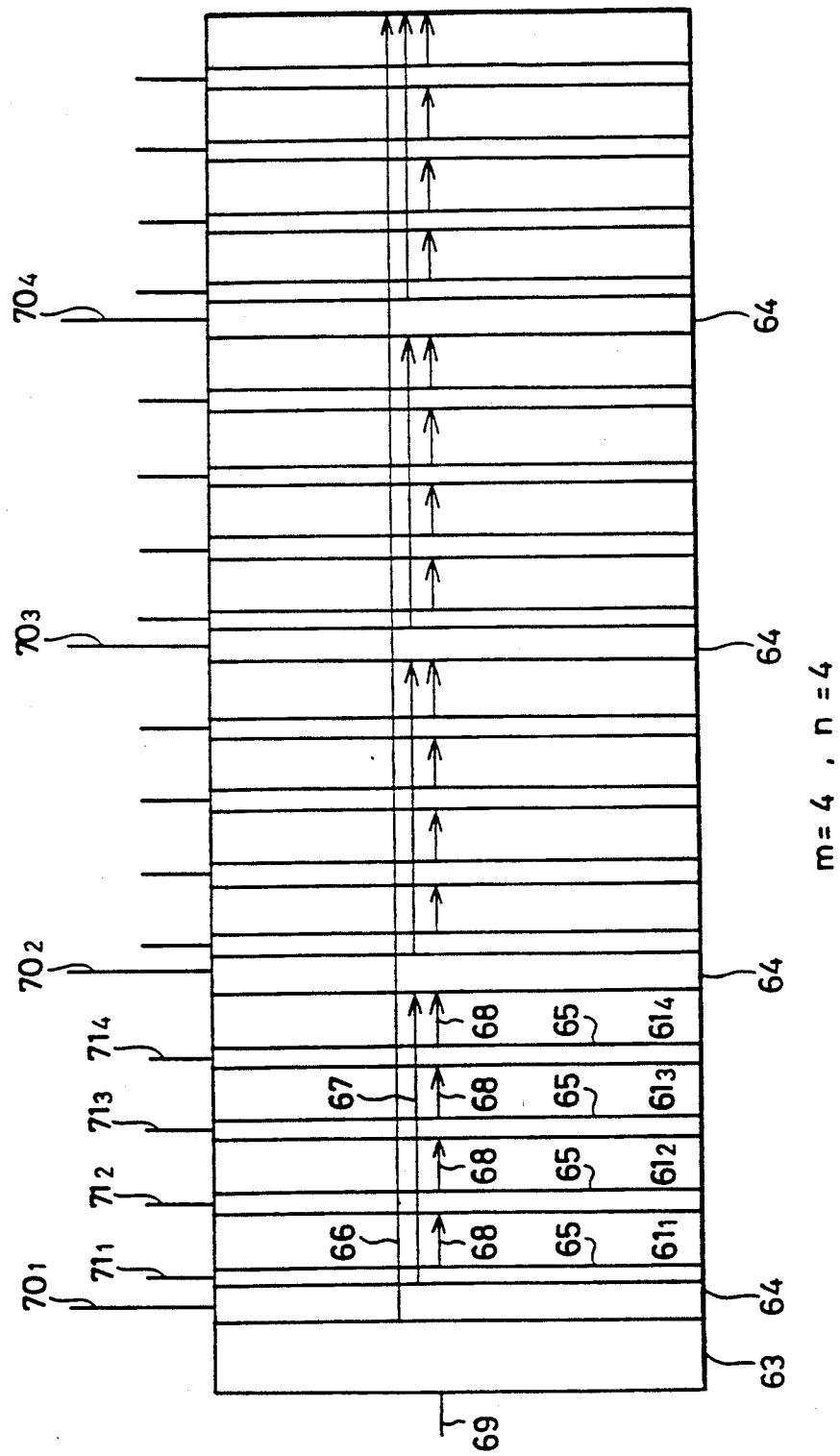
FIG. 2 is a diagram showing a physical layout of the embodiment shown in FIG. 1.

Referring to FIGS. 1 and 2, a memory cell array 7 formed of a plurality of memory cells (not shown) arranged in matrix is first divided into n large memory cell groups $62_1, 62_2, \ldots, 62_n$ and each of the large memory cell groups is further divided into m small memory cell groups (e.g., $61_1, 61_2, \ldots, 61_m$ in the large memory group ($62_1$).

An internal address signal line group 69 is connected with main global decoders $63_1, 63_2, \ldots, 63_k$, which are AND function gates, respectively. Main row-selecting lines $66_1, 66_2, \ldots, 66_k$ are connected to the respective outputs of the main global decoders and are arranged in parallel in one direction. Furthermore, there are provided large memory cell group selecting lines $70_1, 70_2, \ldots, 70_n$ intersecting the main row-selecting lines and formed of a different layer from the main row-selecting lines. Also, a plurality of two-input one-output sub global decoders $64_{11}, 64_{12}, \ldots, 64_{kn}$ which serve as AND function gates, are provided each receiving as inputs the main row-selecting line and the large memory cell group selecting line. Sub row-selecting lines $67_{11}, 67_{21}, \ldots 67_{kn}$ are connected to the respective outputs of the sub global decoders and are arranged in parallel in one direction.

For each large memory cell group, there are provided small memory cell group selecting lines (e.g., $71_1, 72_2, \ldots, 71_m$ in the large memory cell group $62_1$) which are supplied with a signal produced by decoding a column address signal, intersecting the sub row-selecting lines and formed of a different layer from the sub row-selecting lines. A plurality of two-input one-output of local decoders $65_{11}, 65_{12}, \ldots, 65_{km}$ serving as AND function gates are provided each receiving the sub row-selecting line and small memory cell group selecting line as inputs. Word lines $68_{11}, 68_{12}, \ldots, 68_{km}$ divided to be connected to the respective memory cells are connected to the respective outputs of the local decoders and are arranged in parallel in one direction.

A physical layout of the above described semiconductor memory device is not specifically limited; however, in order to make the device simple and operable faster, the main global decoders $63_1$–$63_k$, the sub global decoders $64_{11}$–$64_{kn}$ and the local decoders $65_{11}$–$65_{km}$ are provided near end portions of the memory cell array 7, the large memory cell groups $62_1$–$62_2$ and the small memory cell groups $61_1$–$61_m$, respectively, which are close to a signal source, as shown in FIG. 2 according to this embodiment. Moreover, the main global decoders $63_1$–$63_k$ are, for faster operation, provided close to address input terminals.

The operation of the first embodiment will now be described with reference to FIGS. 1 and 2. A description will be given, for example, on the case of selecting the divided word line $68_{11}$ connected to memory cells in the small memory cell group $61_1$ shown in FIG. 1. In this case, an internal address signal is first applied to the main global decoder $63_1$ via an internal address signal line group 69, and in response to this, the decoder $63_1$ selects the main row-selecting line $66_1$. Furthermore, the sub global decoder $64_{11}$ receives as inputs a row-selecting signal on the main row-selecting line $66_1$ and a signal on the large memory cell group selecting line $70_1$ for selecting the large memory cell group $62_1$ which this small memory cell group $61_1$ belongs to, and in response to this, the decoder $64_{11}$ selects the sub row-selecting line $67_{11}$.

Further, the local decoder $65_{11}$ receives as inputs a row-selecting signal on the sub row-selecting line $67_{11}$ and a signal on the small memory cell group selecting signal line $71_1$ for selecting this small memory cell group $61_1$ and in response to this, the decoder $65_{11}$ selects the divided word line $68_{11}$.

In the first embodiment, the time required for selecting the divided word line $68_{11}$ in the above described manner is determined by delay times on the main row selecting line $66_1$, the sub row-selecting line $67_{11}$ and the divided word line $68_{11}$.

Figure 10A:
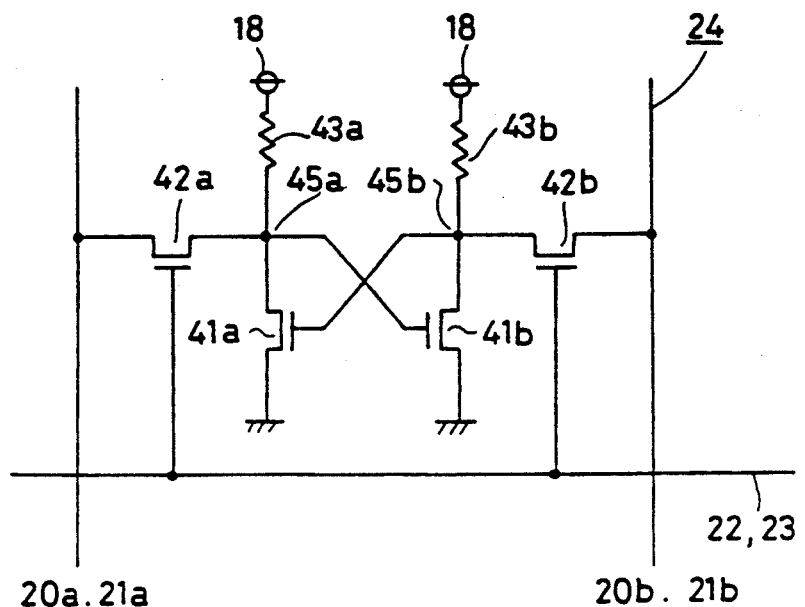
FIGS. 10A and 10B are circuit diagrams showing detailed examples of the memory cell of FIG. 9.
Figure 10B:
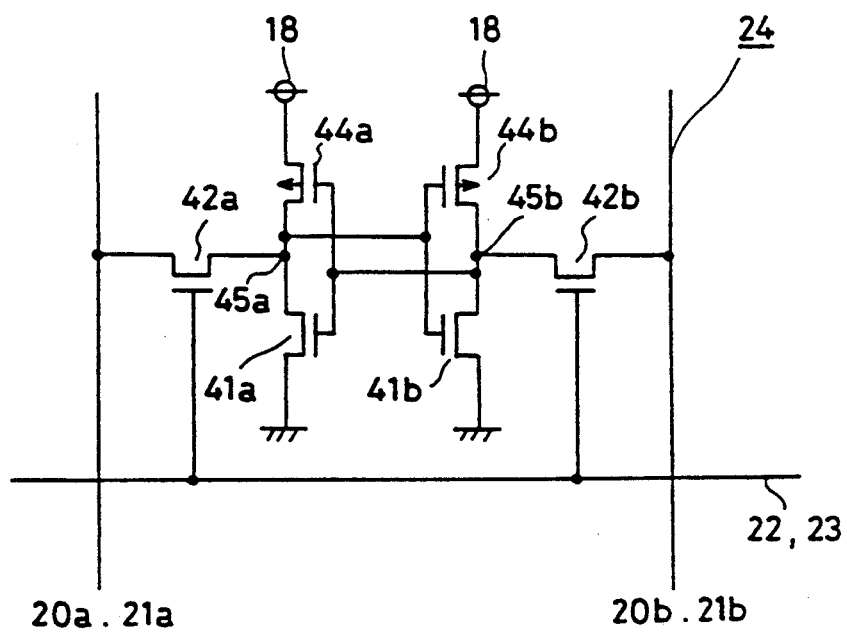
Figure 11:
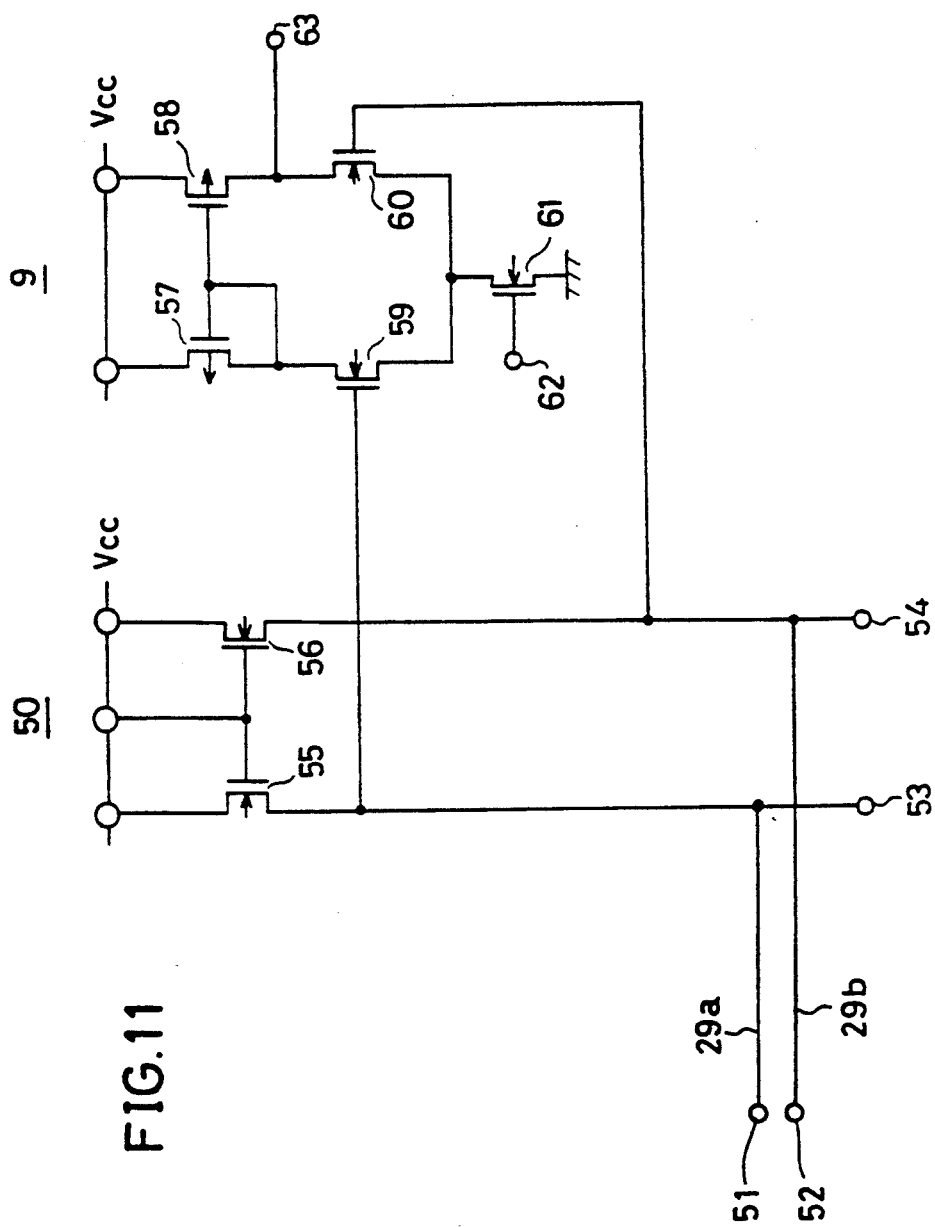
FIG. 11 is a diagram showing a sense amplifier and an I/O line driving circuit shown in FIG. 8.
Figure 12:
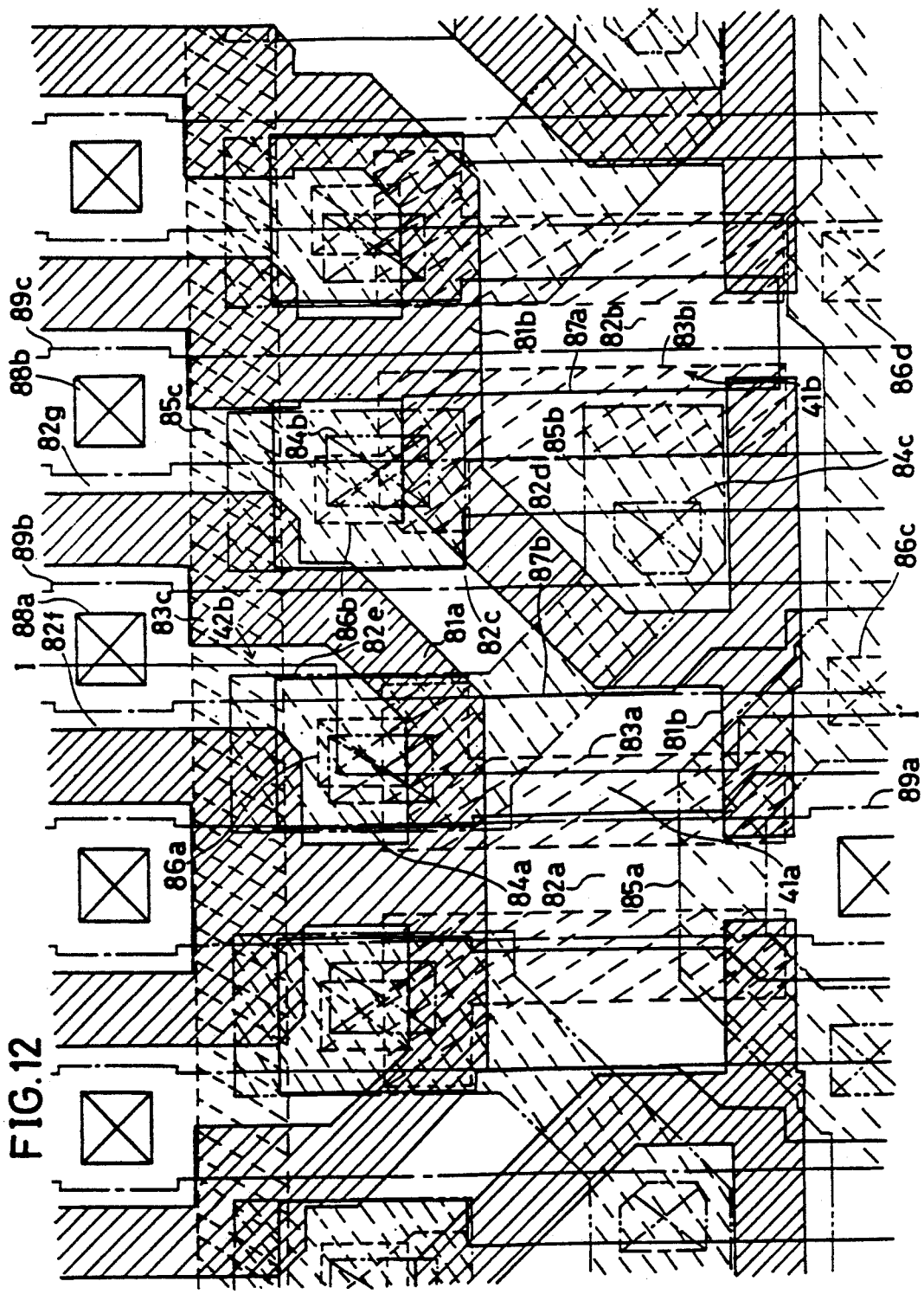
FIG. 12 is a diagram showing one example of layout of the memory cell shown in FIG. 10A.
Figure 13:
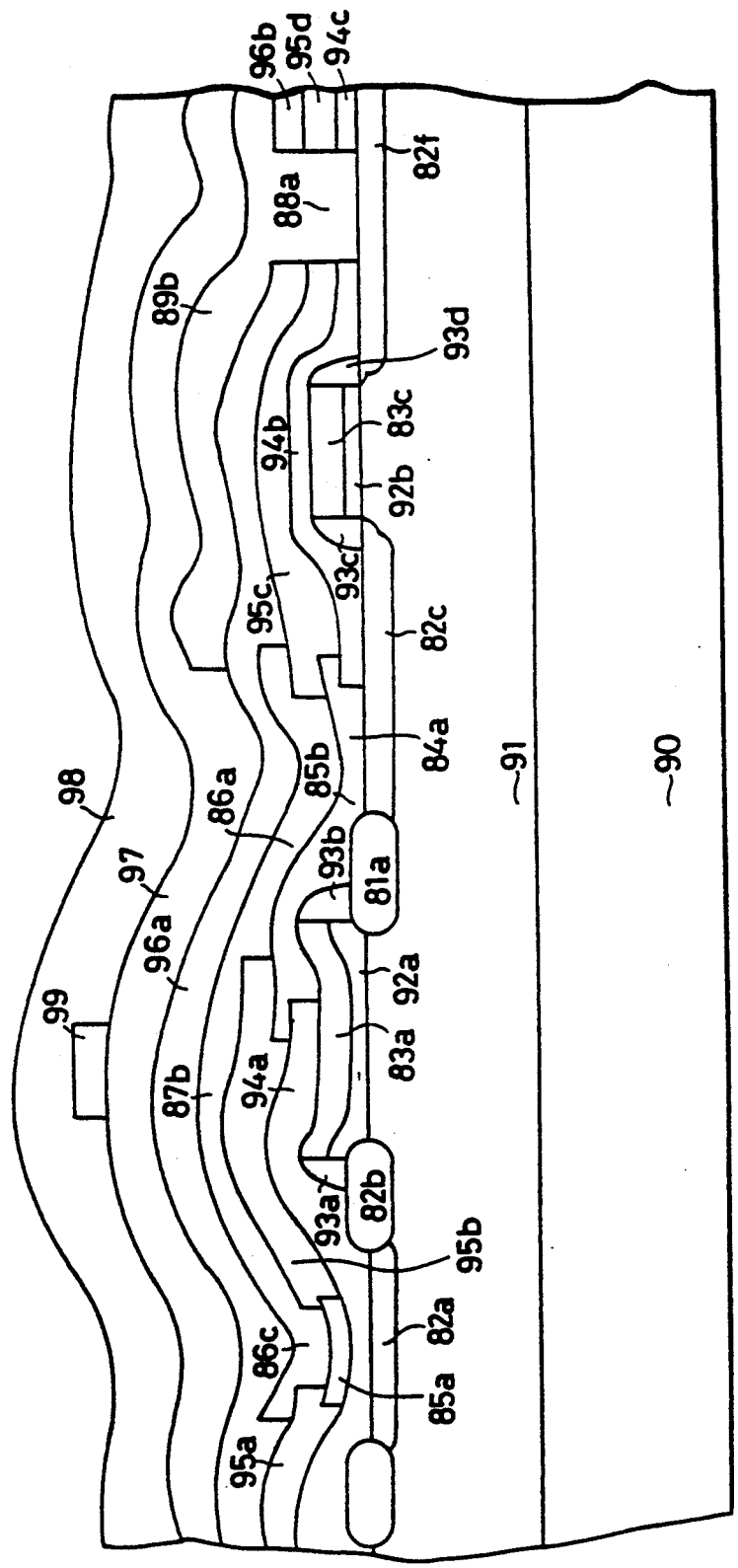
FIG. 13 is a cross-sectional view of the memory cell shown in FIG. 12 taken along the lines I—I'.
Figure 14:
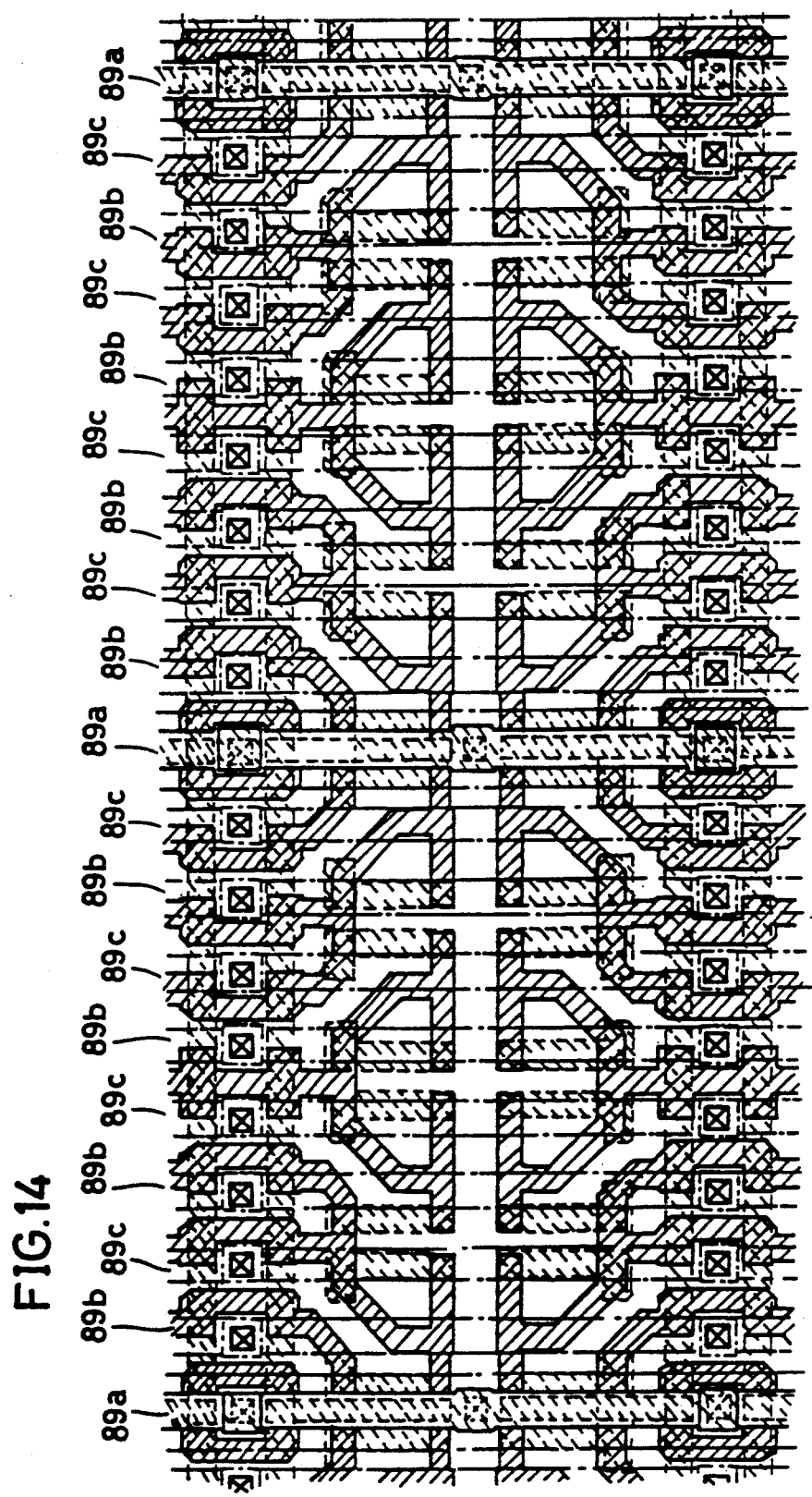
FIG. 14 is a diagram showing a double-row five-column configuration out of the memory cell array shown in FIG. 12.
Figure 15:
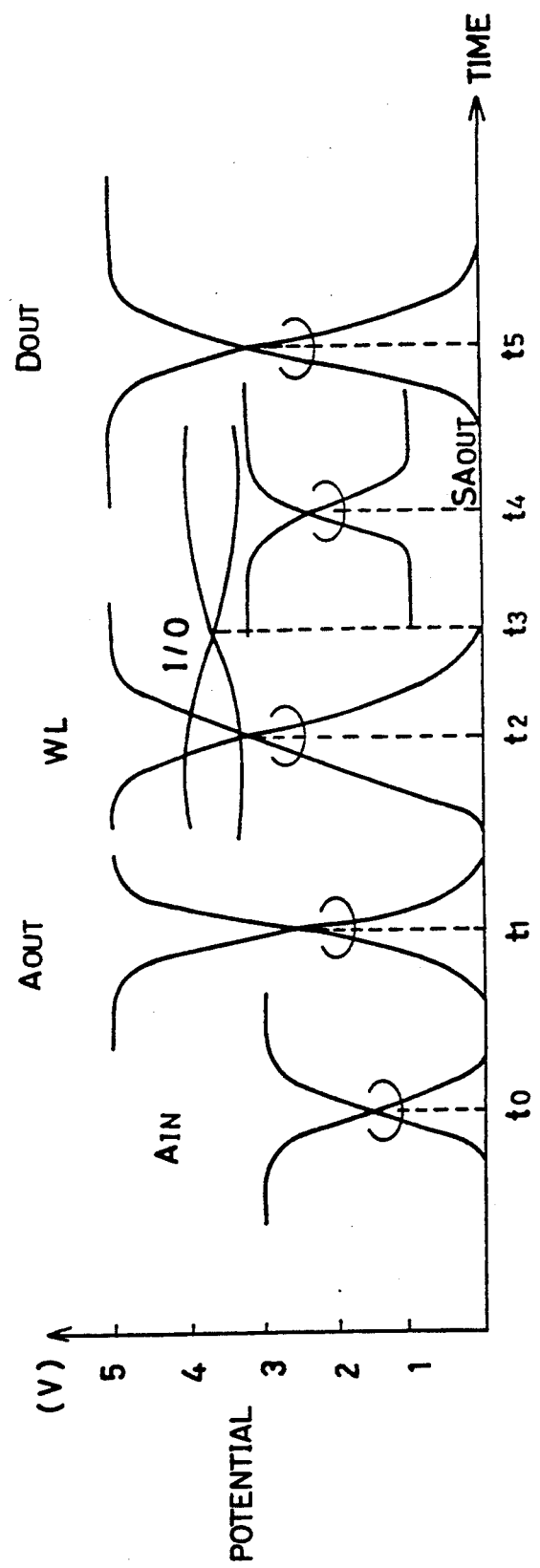
FIG. 15 is a timing chart for describing the operation of the first conventional example.

First of all, neither the main row-selecting line $66_1$ nor the sub row-selecting line $67_{11}$ is directly connected to the memory cell, so that the capacitance of these row-selecting lines does not include a gate capacitance which is the sum of a gate-drain capacitance, a gate-source capacitance and a gate-substrate capacitance of the access transistors 42a, 42b (FIGS. 10A and 10B) of the memory cell, similarly to the described semiconductor memory device of the second conventional example. Therefore, the semiconductor memory device of the present invention is the same as the semiconductor memory device of the second conventional example in that a capacitance per unit length is smaller than the capacitance of the divided word line.

Figure 16:
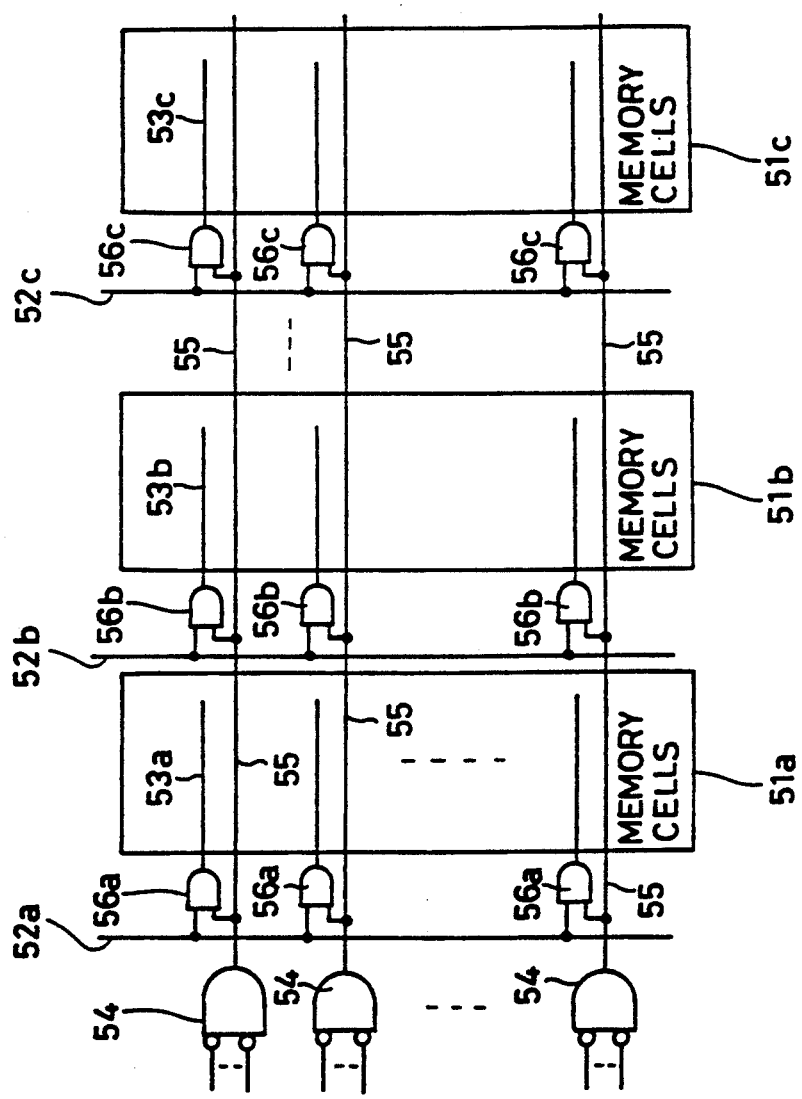
FIG. 16 is a block diagram of the second conventional example.

Such case will now be described that the memory cell array is divided into n (two's power in general) large memory cell groups, and further each of the large memory cell groups is divided into m (two's power in general) small memory cell groups as mentioned above, i.e., the case that the entire memory cell array is divided into small memory cell groups of m×n. As the configuration of the second conventional example shown in FIG. 16 is employed for the configuration that the entire memory cell array is divided into mn small memory cell groups, the number of output load gates connected to each preceding word line becomes apparently m×n. However, in a hierarchical configuration that the conventional preceding word lines are further divided into the main row-selecting lines and the sub row-selecting lines, the number of the output load gates of each of the main row-selecting lines $66_1$–$66_k$ (k is two's power in general) is n, and the number of the output load gates of each of the sub row-selecting lines $67_{11}$–$67_{kn}$ is m, as shown in FIG. 1. That is, the capacitance of each main row-selecting line and that of each sub row-selecting line are in proportion to n, the number of the large memory cell groups and m, the number of the small memory cell groups therein, respectively. Since m and n are both natural numbers of 2 or more, the following inequalities are given:

$$m \leq mn, \quad n \leq mn$$

Therefore, the capacitance of each of the main row-selecting lines and that of each of the sub row-selecting lines become smaller than the capacitance of the preceding word line of the second conventional example, which is proportional to m×n, the total number of the small memory cell groups.

Accordingly, by making the configuration of the preceding word lines 55 of the second conventional example into a double hierarchy configuration of the main row-selecting lines $66_1$–$66_k$ and the sub row-selecting lines $67_{11}$–$67_{kn}$ as in the first embodiment, the total number of load gates to be driven in one cycle becomes (m+n), which is less than the mn in the second conventional example, as shown in the following inequality:

$$m + n \leq mn$$

Therefore, the capacitance of the row selecting lines can be reduced as a whole, resulting in a reduced delay time on the main row-selecting lines and the sub row-selecting lines and thus an increased access speed.

According to the first embodiment, the number of stages of gates for achieving decode functions is larger by one stage than in the described second conventional example, thereby causing a delay corresponding to one state. However, as discussed in the article entitled "An Optimized Output Stage for MOS Integrated Circuits" by HUNG CHANG LIN et al in the "IEEE JOURNAL OF SOLID-STATE CIRCUITS", Apr. 1975, pp. 106–109 and that in Jun. 1975, pp. 185–186, in a large capacity semiconductor memory device of 4M bits or more, for example, a delay caused by the increased number of the output load gate is greater than a delay caused by the increased number of the stages of decode circuitry. Therefore, according to the first embodiment of the present invention, the time to select the memory cell, can be substantially reduced compared to that in the conventional semiconductor memory device.

Furthermore, since the capacitance of the row-selecting lines is substantially reduced, the MOS transistor for driving such large capacitance as in the second conventional example is no longer required, whereby it becomes possible to prevent a fluctuation in the access time due to the hot electron effect and also to decrease a possibility of a disconnection due to the migration of aluminum. Therefore, according to the first embodiment of the present invention, the large capacity semiconductor memory device can attain an enhanced reliability.

In addition, the total number of the load gates to be driven in one cycle decreases in comparison with that in the second conventional example, thereby decreasing the power consumption due to charging/discharging, which is proportional to the expression of (frequency)×(capacitance)×(voltage)$^2$, and thus further decreasing the power consumption in the large capacity semiconductor memory device.

Such reduction in the power consumption inhibits generation of heat in a chip and thus a raise in temperature of the chip. As a result, a further reduction is achieved in the access time of the semiconductor memory device.

Moreover, since a switching current flowing through the row-selecting lines due to charging/discharging is decreased, noise occurring in a power source and on ground line and on a signal line decreases, thereby implementing an electrically stabilized semiconductor memory device.

Furthermore, since the divided word lines $68_{11}$–$68_{km}$ can have their lengths reduced by multi-division of the memory cell array, the CR delay thereon becomes shorter than that in the conventional example, thereby also achieving a further reduction in the access time of the semiconductor memory device.

Since the device can achieve high speed access even with a high resistance rate of a material of the divided word lines $68_{11}$–$68_{km}$ due to the reduction in length thereof, materials of and manufacturing processes of the divided word lines can be selected in a wider range. Consequently, a manufacturing process focused on production yield can be selected, resulting in the semiconductor memory device of a more reduced production cost than that in the conventional example.

In addition, neither the main row-selecting lines $66_1$–$66_k$ nor the sub row-selecting lines $67_{11}$–$67_{kn}$ constitute gate electrodes of the access transistors, so that the materials of these row-selecting lines can be selected irrespectively of a work function. That is, the row selecting lines can employ various row resistance materials such as molybdenum silicide, tungsten silicide, molybdenum, tungsten, aluminum and so on in the wider range of selecting the materials. As a result, since the manufacturing process focused on the production yield can be selected, the manufacturing cost of the semiconductor memory device can be more reduced than in the conventional example.

Furthermore, in the semiconductor memory device according to the first embodiment of the present invention, only the memory cells are accessed which are connected to a selected one of the plurality of divided word lines $68_{11}$–$68_{km}$ in the selected large memory cell group, so that an ineffective current flowing in the memory cells from the load transistor of the bit lines can be reduced to 1/(the number of small memory cell groups)=1/(m×n) in comparison with the first conventional example as described above. Such accomplishment of the lower power consumption in the semiconductor memory device of the first embodiment is similar to that in the second conventional example; however, since it is possible to divide the memory cell array into multi-blocks, that is, to increase the number of the small memory cell groups for the described reason, the device in the first embodiment can have much lower power consumption than that in the second conventional example. The present invention is extremely effective particularly in a CMOS semiconductor memory device because a large amount of DC current flow into the memory cell.

Furthermore, in the semiconductor memory device according to the first embodiment of the present invention, only the memory cells are accessed which are connected to a selected one of the plurality of divided word lines $68_{11}$–$68_{km}$ in the selected large memory cell group, and also the memory cell array can be divided into multi-blocks, so that a very few memory cells are accessed. Therefore, a soft error rate increased by a read operation is drastically decreased, resulting in a further enhancement in reliability of the semiconductor memory device.

Figure 3:
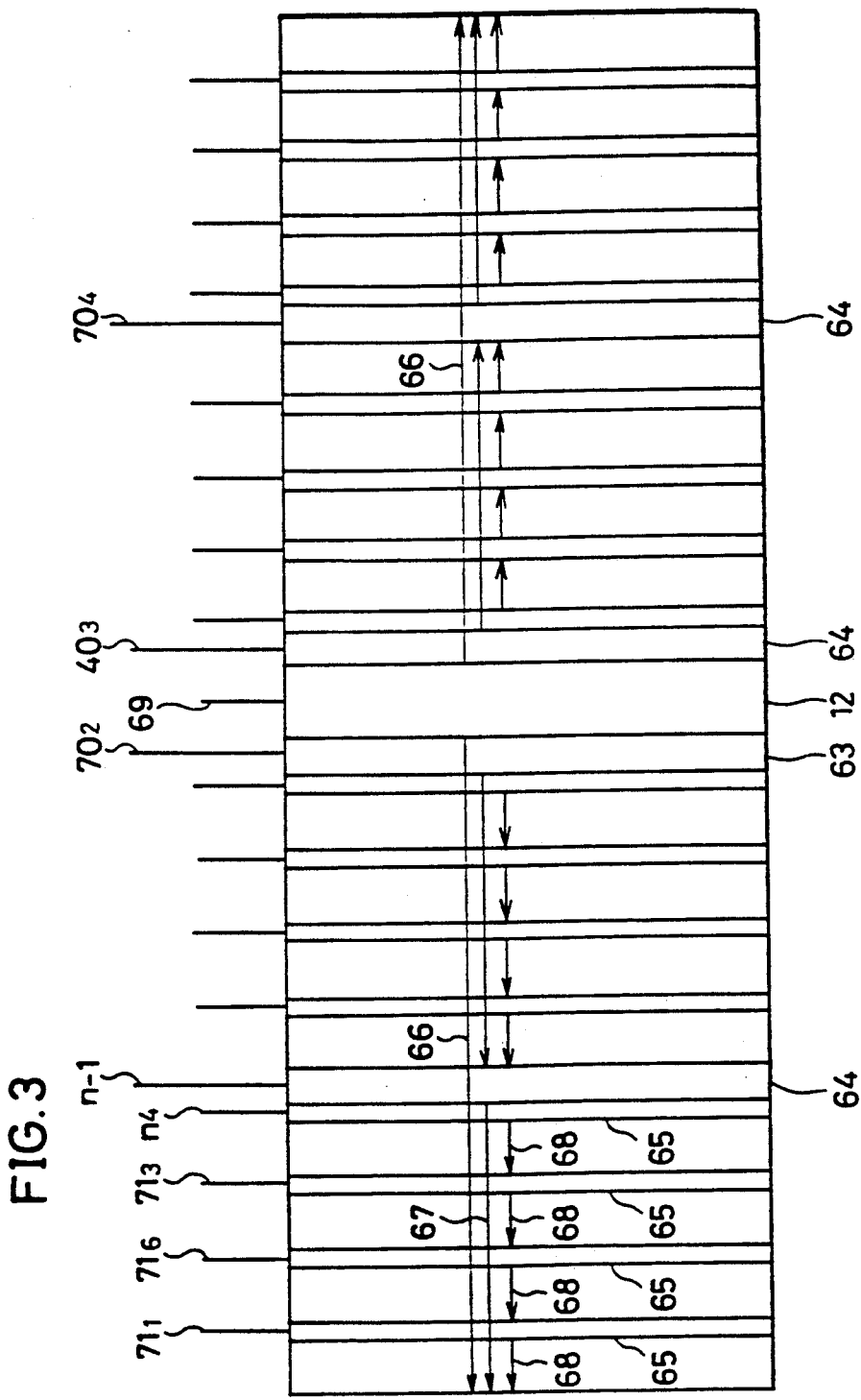
FIG. 3 is a diagram showing a physical layout of a semiconductor memory device according to a second embodiment of the present invention.

Next, a second embodiment of the present invention will be described with reference to FIG. 3. In this embodiment, the main global decoders $63_1$–$63_k$ are provided at the intermediate portion of the memory cell array in order to reduce the length of each of the main row-selecting lines 66. In this case, a layout of the sub global decoders $64_{11}$–$64_{kn}$ and the local decoders $65_{11}$–$65_{km}$ is not specifically limited; however, these decoders are provided at the end portions, close to the signal source, of the large memory cell groups $62_1$–$62_n$ and the small memory cell groups $61_1$–$61_m$, respectively, for a high speed operation. According to the second embodiment, a further reduction in the access time can be accomplished in addition to the various effects of the first embodiment. Moreover, if the main row-selecting lines at the left portion and those at the right portion in FIG. 3 are configured to be selectively driven independently, the capacitance of the main row-selecting lines can further be reduced, resulting in higher access speed, reduced power consumption and enhanced reliability of the device.

Figure 4:
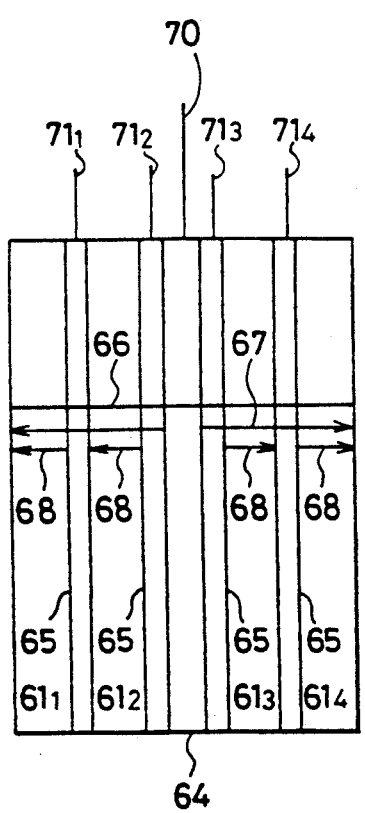
FIG. 4 is a diagram showing a physical layout of a semiconductor memory device according to a third embodiment of the present invention.

A third embodiment of the present invention will then be described with reference to FIG. 4. In this embodiment, the sub global decoders $64_{11}$–$64_{kn}$ are provided at the intermediate portions of the large memory cell groups $62_1$–$62_n$, respectively, in the layout of the memory cell array in FIGS. 2 and 3 in order to reduce the length of each of the sub row-selecting lines 67. In this case, the layout of the local decoders $65_{11}$–$65_{km}$ is not specifically limited; however, they are provided at the end portions, close to the signal source, of the small memory cell groups $61_1$–$61_m$, respectively, for a high speed operation. According to the third embodiment, a further reduction in access time can be achieved in addition to effects of the first and second embodiments.

Furthermore, if the sub row-selecting lines at the left portion and those at the right portion in FIG. 8 are configured to be selectively driven independently, the capacitance of the sub row-selecting lines can be reduced, resulting in higher access speed, reduced power consumption and enhanced reliability of the device.

Next, a fourth embodiment of the present invention will be described with reference to FIG. 5. In this embodiment, the local decoders $65_{11}$–$65_{km}$ are provided at the intermediate portions of the respective small memory cell groups in the layout of the memory cell array in FIGS. 9, 10A, 10B and 11 in order to reduce the length of each of the divided word lines 68. According to this embodiment, the access time can further de reduced in addition to the various effects of the first, second and third embodiments.

Figure 5:
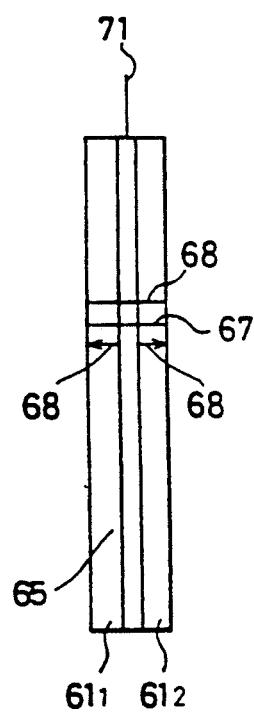
FIG. 5 is a diagram showing a physical layout of a semiconductor memory device according to a fourth embodiment of the present invention.

Furthermore, if the respective divided word lines at the left portion and those at the right portion in FIG. 5 can be selectively driven independently, the capacitance of the divided word lines can be more reduced and the number of the memory cells to be activated decreases, resulting in higher access speed, decreased power consumption and enhanced reliability.

Next, a description will be given on the configuration of the semiconductor memory device according to a fifth embodiment of the present invention with reference to FIG. 6.

Figure 6:
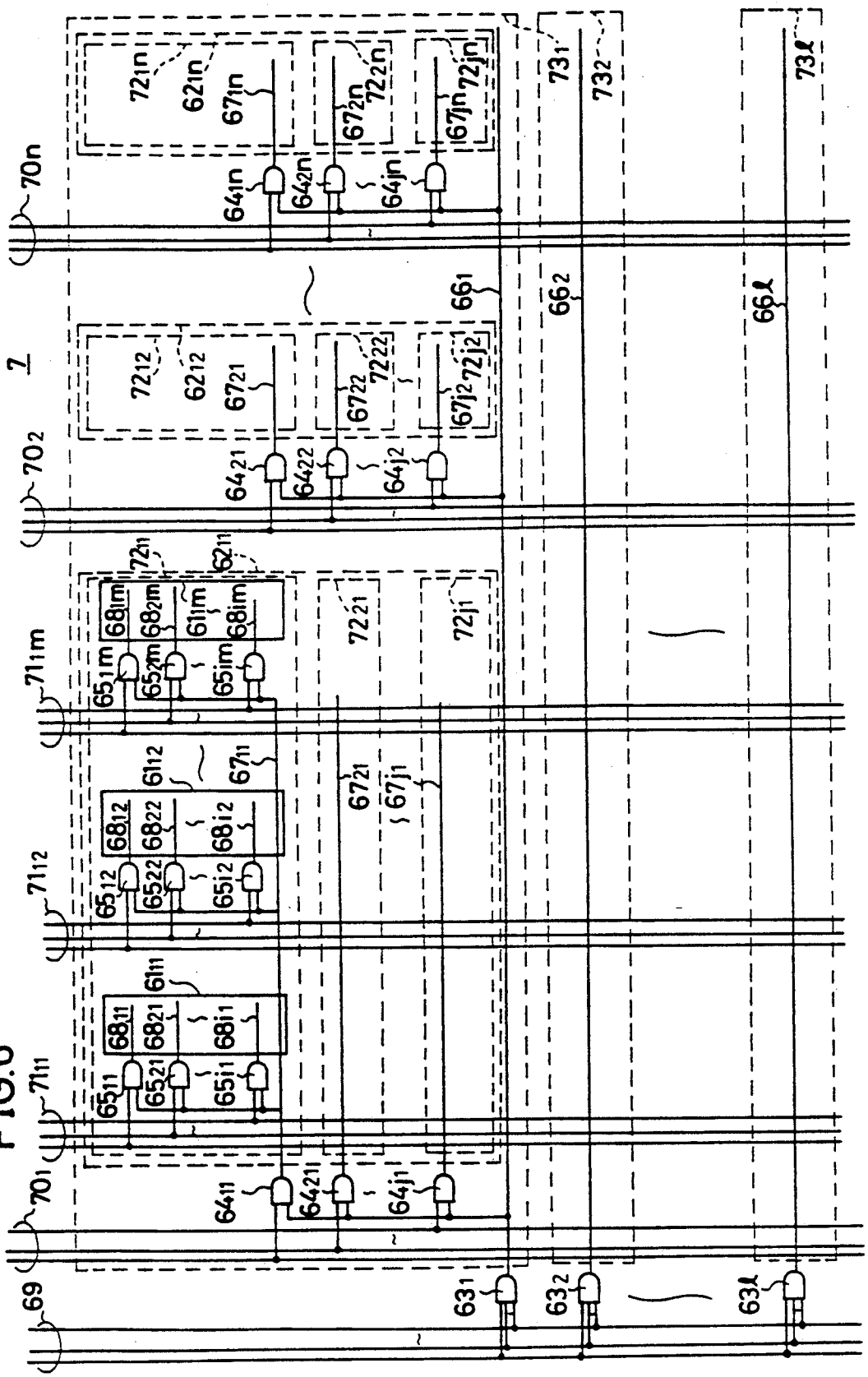
FIG. 6 is a block diagram showing a semiconductor memory device according to a fifth embodiment of the present invention.

Referring to FIG. 6, a memory cell array 7 formed of a plurality of memory cells (not shown) arranged in matrix is first divided into 1 large memory cell row groups (each formed of ij rows) $73_1$–$73_l$, and each of the large memory cell row groups is further divided into n large memory cell groups (e.g., $62_{11}$–$62_{1n}$ in the large memory cell row group $73_1$). Each of the large memory cell groups $62_{11}$–$62_{1n}$ is divided into small memory cell row groups (each formed of i rows) $72_{11}$–$72_{j1}$, each of the small memory cell row groups is further divided into m small memory cell groups (e.g., $61_{11}$–$61_{1m}$ in the small memory cell row group $72_{11}$)

Main global decoders $63_1$–$63_l$ serving as AND function gates are connected to an internal address signal line group 69 and their outputs connected to main row selecting lines $66_1$–$66_l$, respectively, and then arranged in parallel in one direction. Each of the main global decoders selects i×j rows collectively.

In addition, there are provided large memory cell group selecting lines $70_1$–$70_n$ for selecting the plurality of large memory cell groups, which are arranged in one column, intersecting the main row-selecting lines $66_1$–$66_l$ and formed of a different layer from the main row-selecting lines, and one of the small memory cell row groups in each of the large memory cell groups. A plurality of sub global decoders $64_{11}$–$64_{jn}$ are also provided serving as AND function gates and receiving as their inputs the main row selecting lines and the large memory cell group selecting lines. The sub global decoders have their outputs connected to sub row-selecting lines $67_{11}$–$67_{jn}$, respectively, and are arranged in parallel in one direction. Each of the sub global decoders selects i rows collectively.

Furthermore, there are provided small memory cell group selecting lines $71_{11}$–$71_{1m}$ for selecting the plurality of small memory cell groups, which are arranged in one column, intersecting the sub row-selecting lines $67_{11}$–$67_{jn}$ and formed of a different layer from the sub row-selecting lines, and one row of each of the small memory cell groups. A plurality of local decoders $65_{11}$–$65_{im}$ are provided which serve as AND function gates and receive as their inputs sub row-selecting lines and the small memory cell group selecting lines. The local decoders have their outputs connected to divided word lines $68_{11}$–$68_{im}$ connected to the memory cells, respectively, and are arranged in parallel in one direction. The small memory cell group selecting signal lines $71_{11}$–$71_{1m}$ are supplied with signals obtained by decoding row address data and column address data.

A physical layout of the described semiconductor memory device is not specifically limited; however, for simplification in this embodiment, the main global decoders $63_1$–$63_l$, the sub global decoders $64_{11}$–$64_{jn}$ and the local decoders $65_{11}$–$65_{im}$ are provided at the end portions, close to a signal source, of the memory cell array 7, the large memory cell groups $62_{11}$–$62_{1n}$ and the small memory cell groups $61_{11}$–$61_{1m}$, respectively. Also in this embodiment, the main global decoders $63_1$–$63_l$ are provided close to address input terminals for a higher access speed. Since the main row-selecting lines $66_1$–$66_l$ and the sub row-selecting lines $67_{11}$–$67_{jn}$ extend in the same direction as bit lines, they are arranged between any memory cell groups.

An operation of the fifth embodiment will now be described. A description will be given, for example, on the case that the divided word line $68_{11}$ connected to the memory cells in the small memory cell group $61_{11}$ in FIG. 6. In this case, an internal address signal is first applied to the main global decoder $63_1$ via the internal address signal line group 69, and in response to this, the decoder $63_1$ selects the main row-selecting line $66_1$ corresponding to the large memory cell row group $73_1$. Further, the sub global decoder $64_{11}$ receives as its input a row-selecting signal on the main row-selecting line $66_1$ and a signal on the large memory cell group selecting line $70_1$ for selecting the large memory cell group $62_{11}$ and the small memory cell row group $72_{11}$, respectively, to which the small memory cell group $61_{11}$ belongs, and in response to this, the decoder $64_{11}$ selects the sub row-selecting line $67_{11}$. Further, the local decoder $65_{11}$ receives as its input a row selecting signal on the sub row-selecting line $67_{11}$ and a signal on the small memory cell group selecting line $71_{11}$ for selecting the row of the small memory cell group $61_{11}$, respectively, to which the memory cell belongs, and in response to this, the decoder $65_{11}$ selects the divided word line $68_{11}$.

According to this embodiment, the number of the main global decoders $63_1 63_l$ decreases to 1/(ij) compared to that in the first embodiment, and the number of the sub global decoders $64_{11}$–$64_{jn}$ decreases to 1/i, so that power consumption is further reduced in addition to the various effects of the first embodiment.

Moreover, according to this embodiment, the number of the main row-selecting lines $66_1$–$66_l$ and of the sub row-selecting lines $67_{11}$–$67_{jn}$ decreases, so that even if both or either of these lines is provided between the memory cells, an increase in a chip area is negligible. Also in this case, the capacitance of the main row-selecting lines $66_1$–$66_l$ and of the sub row-selecting lines $67_{11}$–$67_{jn}$ decreases, so that the access time can further be reduced in addition to the various effects of the first embodiment.

Furthermore, according to the embodiment of FIG. 6, the number of intersections between bit lines and the main row-selecting lines $66_1$–$66_l$ and sub row-selecting lines $67_{11}$–$67_{jn}$ decreases, so that the capacitance of the bit lines decreases. Therefore, a further reduction in access time can be achieved in addition to the numerous effects of the first embodiment.

The decrease in the number of the intersections as above causes a decrease in the number of short circuits of the bit lines to the main row-selecting lines $66_1$–$66_l$ and the sub row-selecting lines $67_{11}$–$67_{jn}$, resulting in a higher production yield. Consequently, a manufacturing cost of the semiconductor memory device can be reduced in addition to the numerous effects of the first embodiment.

Moreover, combinations of the fifth embodiments and the described second, third, and fourth embodiments cause a higher access speed, the more reduced power consumption and the higher reliability of the device.

FIG. 7 is a diagram showing the memory cells employed in each embodiment of the present invention. An example shown in FIG. 7 has such a configuration that memory cells 13 each including one memory transistor 21 and one capacitor 22 are arranged in matrix. The memory transistor 21 has a gate connected with a word line $68_{11}$ connected to a local decoder 65, a drain connected with a bit line 20 connected to column decoders 6a, 6b and a source grounded via the capacitor 22.

The semiconductor memory device thus structured provides no effect of reducing a DC current to the memory cell 13, but provides effects similar to those of the first to fifth embodiments.

In each of the above-mentioned embodiments, the sub local decoders and local decoders are each formed of simpler gate circuits compared to the decoders having two inputs and one output, and thus require only a negligible increase in area.

Further, in each of the above-mentioned embodiments, such combinations are possible for materials of the main row-selecting lines, sub row-selecting lines and divided word lines as follows.

(1) The main row-selecting line can be formed of one of a polysilicon layer, a first metal interconnection layer and a second metal interconnection layer.

(2) The sub row-selecting line can be formed of one of the polysilicon layer, the first metal interconnection layer and the second metal interconnection layer.

(3) The divided word line can be formed of one of the polysilicon layer, the first metal interconnection layer and the second metal interconnection layer.

The above described polysilicon layer can be shared with a polysilicon layer constituting the gate of the access transistor of the memory cell, thereby implementing the large capacity semiconductor memory device without an area of the memory cell increased.

The formation of the described main row-selecting line and sub row-selecting line with the same layer simplifies the manufacturing process of the device and thus further reduces the manufacturing cost thereof. Particularly, in the case of the fifth embodiment, and in the case of the combination of the fifth embodiment and the second, third or fourth embodiment, the number of the main row-selecting lines and sub row-selecting lines is small, so that a spacing of interconnections becomes larger. Accordingly, it becomes possible to manufacture the semiconductor memory device at a lower cost without the chip area increased.

Furthermore, if the described main row selecting lines and sub row-selecting lines are formed of different layers from each other, the chip area does not increase depending on a spacing of the main row selecting lines and that of the sub row-selecting lines, thereby achieving a semiconductor memory device having a small chip area.

As a matter of course, the semiconductor memory device with a much enhanced speed operability can be implemented if the described polysilicon layer is made polycide with such materials as molybdenum and tungsten.

In addition, in all the embodiments of the present invention, the main global decoders, the sub global decoders and the local decoders are all denoted with a symbol of AND gates; however, their inputs and outputs may be low active or high active, and these decoders are AND function gates in a broader sense, as a matter course.

Such an example was shown in all the embodiments of the present invention that the column selecting lines are divided into double-hierarchy of the main row-selecting lines and sub row-selecting lines; however, it is more preferable, of course, that larger capacity semiconductor memory devices have multi-hierarchical configurations such as triple-hierarchy or quadruple hierarchy.

As has been described, according to the present invention, separately providing the row-selecting lines and word lines and further dividing the row-selecting lines into the first and second row selecting lines makes it possible to further reduce the capacitance and resistance of the row-selecting lines and to enhance the access speed and reliability in operation, in the large-capacity semiconductor memory device. Moreover, the present invention makes it possible to further reduce the total number of load gates to be driven in one cycle of the operation of the semiconductor memory device, further decrease power consumption and also widen a range for selecting materials of and manufacturing processes of the word lines and row selecting lines.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array formed of a plurality of memory cells arranged in matrix and each including one transistor and one capacitor; wherein said memory cell array is divided in the direction of columns into a plurality of large groups of memory cells, and each of said plurality of large memory cell groups is further divided in the direction of columns into a plurality of small groups of memory cells, said semiconductor memory device further comprising:
   a plurality of first row-selecting lines provided in said memory cell array;
   a plurality of second row-selecting lines provided in each of said plurality of large memory cell groups;
   a plurality of word lines provided in each of said plurality of small memory cell groups and connected to said memory cells;
   means for supplying a first selecting signal for selecting one of said plurality of large memory cell groups;
   means for supplying a second selecting signal for selecting one of said plurality of small memory cell groups;
   first decoder means responsive to an internal address signal for selecting one of said first row-selecting lines to activate the selected first row-selecting line;
   a plurality of second decoder means provided in each said large memory cell group for selecting a second row-selecting line associated with said selected first row-selecting line to activate the selected second row-selecting line in the large memory cell group selected by said first selecting signal; and
   a plurality of third decoder means provided in each said small memory cell group for selecting a word line associated with said selected second row-selecting line to activate the selected word line in the small memory cell group selected by said second selecting signal.

2. A semiconductor memory device in accordance with claim 1, wherein
   said first decoder means is provided near the end portion of said memory cell array, which is close to a supply source of said internal address signal.

3. A semiconductor memory device in accordance with claim 1, wherein
   said first decoder means is provided at the center of said memory cell array.

4. A semiconductor memory device in accordance with claim 3, wherein
   said first row-selecting lines separated horizontally by said first decoder means are driven independently by said first decoder means.

5. A semiconductor memory device in accordance with claim 2, wherein said second decoder means are each provided at the center of a corresponding one of said large memory cell groups.

6. A semiconductor memory device in accordance with claim 5, wherein
said second row-selecting lines separated horizontally by said second decoder means are driven independently by said second decoder means.

7. A semiconductor memory device in accordance with claim 3, wherein
said second decoder means are each provided at the center of a corresponding one of said large memory cell groups.

8. A semiconductor memory device in accordance with claim 7, wherein
said second row-selecting lines separated horizontally by said second decoder means are driven independently by said second decoder means.

9. A semiconductor memory device in accordance with claim 2, wherein
said third decoder means are each provided at the center of a corresponding one of said small memory cell groups.

10. A semiconductor memory device in accordance with claim 9, wherein
said word lines separated horizontally by said third decoder means are driven independently by said third decoder means.

11. A semiconductor memory device in accordance with claim 3, wherein
said third decoder means are each provided at the center of a corresponding one of said small memory cell groups 12. A semiconductor memory device in accordance with claim 11, wherein
said word lines separated horizontally by said third decoder means are driven independently by said third decoder means.

13. A semiconductor memory device in accordance with claim 5, wherein
said third decoder means are each provided at the center of a corresponding one of said small memory cell groups.

14. A semiconductor memory device in accordance with claim 13, wherein
said word lines separated horizontally by said third decoder means are driven independently by said third decoder means.

15. A semiconductor memory device in accordance with claim 7, wherein
said third decoder means are each provided at the center of a corresponding one of said small memory cell groups 16. A semiconductor memory device in accordance with claim 15, wherein
said word lines separated horizontally by said third decoder means are driven independently by said third decoder means.

17. A semiconductor memory device in accordance with claim 1, wherein
said first row-selecting lines are each formed of one of a polysilicon or silicide layer, a first metal interconnection layer and a second metal interconnection layer;
said second row-selecting lines are each formed of one of the polysilicon or silicide layer, the first metal interconnection layer and the second metal interconnection layer; and
said word lines are each formed of one of the polysilicon or silicide layer, the first metal interconnection layer and the second metal interconnection layer.

18. A semiconductor memory device in accordance with claim 17, wherein
said first and second row-selecting lines are formed as the same layer.

19. A semiconductor memory device in accordance with claim 17, wherein
said first and second row-selecting lines are formed as different layers.

20. A semiconductor memory device in accordance with claim 1, wherein
said first, second and third decoder means are each constituted by a gate having an AND function.

21. A semiconductor memory device comprising:
a memory cell array formed of a plurality of memory cells arranged in matrix and each including one transistor and one capacitor; wherein said memory cell array is divided in the direction of rows into a plurality of large row groups of memory cells, each of said plurality of large memory cell row groups is further divided in the direction of columns into a plurality of large groups of memory cells, each of said plurality of large memory cell groups is further divided in the direction of rows into a plurality of small row groups of memory cells, and each of said plurality of small memory cell row groups is divided in the direction of columns into a plurality of small groups of memory cells, said semiconductor memory device further comprising:
a plurality of first row-selecting lines each provided in each said large memory cell row group;
a plurality of second row-selecting lines each provided in each said small memory cell row group;
a plurality of word lines provided in each of said small memory cell groups and connected to said memory cells;
means for supplying a first selecting signal for selecting said plurality of large memory cell groups arranged in the same column and one of the small memory cell row groups in each of said large memory cell groups;
means for supplying a second selecting signal for selecting said plurality of small memory cell groups arranged in the same column and a row in each of said small memory cell groups;
first decoder means responsive to an internal address signal for selecting one of said first row-selecting lines to activate the selected first row-selecting line;
a plurality of second decoder means provided in each said large memory cell group for selecting one of said plurality of second row-selecting lines, which corresponds to the small memory cell row group selected by said first selecting signal to activate the selected second row-selecting line, in one of the plurality of large memory cell groups selected by said first selecting signal, which is included in the large memory cell row group corresponding to said selected first row-selecting line; and
a plurality of third decoder means provided in each said small memory cell group for selecting one of said plurality of word lines, which corresponds to the row selected by said second selecting signal and activating the selected word line, in one of the plurality of small memory cell groups selected by said second selecting signal, which is included in the small memory cell row group corresponding to said selected second row-selecting line.

22. A semiconductor memory device in accordance with claim 21, wherein
said first decoder means is provided near the end portion of said memory cell array, which is close to a supply source of said internal address signal.

23. A semiconductor memory device in accordance with claim 21, wherein
said first decoder means is provided at the center of said memory cell array.

24. A semiconductor memory device in accordance with claim 23, wherein
said first row selecting lines separated horizontally by said first decoder means are driven independently by said first decoder means.

25. A semiconductor memory device in accordance with claim 22, wherein
said second decoder means are each provided at the center of a corresponding one of said large memory cell groups.

26. A semiconductor memory device in accordance with claim 25, wherein
said second row-selecting lines separated horizontally by said second decoder means are driven independently by said second decoder means.

27. A semiconductor memory device in accordance with claim 23, wherein
said second decoder means are each provided at the center of a corresponding one of said large memory cell groups.

28. A semiconductor memory device in accordance with claim 27, wherein
said second row-selecting lines separated horizontally by said second decoder means are driven independently by said second decoder means.

29. A semiconductor memory device in accordance with claim 22, wherein
said third decoder means are each provided at the center of a corresponding one of said small memory cell groups.

30. A semiconductor memory device in accordance with claim 29, wherein
said word lines separated horizontally by said third decoder means are driven independently by said third decoder means.

31. A semiconductor memory device in accordance with claim 23, wherein
said third decoder means are each provided at the center of a corresponding one of said small memory cell groups.

32. A semiconductor memory device in accordance with claim 31, wherein
said word lines separated horizontally by said third decoder means are driven independently by said third decoder means.

33. A semiconductor memory device in accordance with claim 25, wherein
said third decoder means are provided at the center of a corresponding one of said small memory cell groups.

34. A semiconductor memory device in accordance with claim 33, wherein
said word lines separated horizontally by said third decoder means are driven independently by said third decoder means.

35. A semiconductor memory device in accordance with claim 27, wherein
said third decoder means are each provided at the center of a corresponding one of said small memory cell groups.

36. A semiconductor memory device in accordance with claim 35, wherein
said word lines separated horizontally by said third decoder means are driven independently by said third decoder means.

37. A semiconductor memory device in accordance with claim 21, wherein
said first row-selecting lines are each formed of one of a polysilicon or silicide layer, a first metal interconnection layer and a second metal interconnection layer;
said second row-selecting lines are each formed of one of the polysilicon or silicide layer, the first metal interconnection layer and the second metal interconnection layer; and
said word lines are each formed of one of the polysilicon or silicide layer, the first metal interconnection layer and the second metal interconnection layer.

38. A semiconductor memory device in accordance with claim 37, wherein
said first and second row-selecting lines are formed as the same layer.

39. A semiconductor memory device in accordance with claim 37, wherein
said first and second row-selecting lines are formed as different layers.

40. A semiconductor memory device in accordance with claim 21, wherein
said first, second and third decoder means are each constituted by a gate having an AND function.

* * * * *